(12) United States Patent
Mun et al.

(10) Patent No.: US 6,642,123 B2
(45) Date of Patent: Nov. 4, 2003

(54) METHOD OF FABRICATING A SILICON WAFER INCLUDING STEPS OF DIFFERENT TEMPERATURE RAMP-UP RATES AND COOL-DOWN RATES

(76) Inventors: Young-Hee Mun, #730-766, 108/403 Sangmo Woobang Apt., Sangmo-dong, Gumi-shi, Kyungsangbuk-do (KR); Gun Kim, 283, Imsoo-dong, Gumi-shi, Kyongsangbuk-do (KR); Sung-Ho Yoon, 283, Imsoo-dong, Gumi-shi, Kyongsangbuk-do (KR)

(*) Notice: Subject to any disclaimer, the term of this patent is extended or adjusted under 35 U.S.C. 154(b) by 0 days.

(21) Appl. No.: 10/156,180

(22) Filed: May 29, 2002

(65) Prior Publication Data
US 2003/0089967 A1 May 15, 2003

(30) Foreign Application Priority Data
Nov. 12, 2001 (KR) .......................................... 2001-70062

(51) Int. Cl.⁷ .............................. H01L 21/76; C30B 5/00
(52) U.S. Cl. ........................... 438/402; 438/471; 117/4; 117/2; 117/20
(58) Field of Search ................................. 257/610, 611, 257/617; 438/471, 473, 400, 402; 117/2, 4, 20; 148/DIG. 24, DIG. 60

(56) References Cited

U.S. PATENT DOCUMENTS 6,548,886 B1 * 4/2003 Iraki et al. .................. 257/610
6,573,159 B1 * 6/2003 Kobayashi et al. .......... 438/471
6,579,779 B1 * 6/2003 Falster ........................ 438/471
2002/0185053 A1 * 12/2002 Fei et al. ........................ 117/2

FOREIGN PATENT DOCUMENTS

WO        WO98/38675        9/1998

* cited by examiner

Primary Examiner—David Nelms
Assistant Examiner—Long Tran

(57) ABSTRACT

A method of fabricating a silicon wafer, which includes the steps of preparing a silicon wafer by slicing, grinding, and cleaning an ingot, inserting the silicon wafer in a diffusion furnace having an ambience of one of Ar, $N_2$ and inert gas including Ar and $N_2$, pre-heating and maintaining the diffusion furnace at about 500° C., changing the ambience into one of $H_2$, Ar and inert gas including $H_2$ and Ar successively, increasing a temperature of the diffusion furnace by a temperature-increasing speed of 50~70° C./min between 500~800° C., 10~50° C./min between 800~900° C., 0.5~10° C./min between 900~1000° C., and 0.1~0.5° C./min between 1000~1250° C., maintaining the diffusion furnace at 1200~1250° C. for 1~120 min, changing the ambience inside the diffusion furnace into one of Ar, $N_2$ and inert gas ambience including Ar and $N_2$ successively, and decreasing the temperature of the diffusion furnace down to 500 ° C. by a temperature-decreasing speed of 0.1~0.5° C./min between 1000~1250° C., 0.5~10° C./min between 900~1000° C., 10~50° C./min between 800~900° C., and 50~70° C./min between 500~800° C.

2 Claims, 3 Drawing Sheets

METHOD OF FABRICATING A SILICON WAFER INCLUDING STEPS OF DIFFERENT TEMPERATURE RAMP-UP RATES AND COOL-DOWN RATES

BACKGROUND OF THE INVENTION

1. Field of the Invention

The present invention relates to a method for heat treatment and particularly to a method for heat treatment of a silicon wafer capable of reducing crystal originated particles in the near surface region.

2. Background of the Related Art

As semiconductor integrated circuit devices (semiconductor devices) become more highly integrated, the corresponding design rule is reduced so as to make the process of fabricating a semiconductor device more difficult. Thus, improvement of wafer quality is required to increase the yield realized from the fabrication process of semiconductor devices as well as the reliability of the semiconductor devices produced.

Accordingly, a surface layer of the silicon wafer, on which devices are fabricated, must be free of defects. Crystal Originated Particles (COPs), which are introduced into the single silicon crystal during crystal growth, are present on the surface layer of the silicon wafer, degrading the electrical reliability of the silicon wafer. Therefore, many efforts have been made to develop a wafer free from COP defects.

In addition, a wafer having a gettering means for trapping transition metals, which induce fatal defects to devices in the process of fabricating semiconductor devices on the wafer, is required. Oxygen precipitates located in the active device region of the wafer can impair the operation of the device. Oxygen precipitates located in the bulk of the wafer, however, are capable of trapping undesired metal impurities. The use of oxygen precipitates located in the bulk of the wafer to trap metals is referred to as 'gettering?' In the process of fabricating a semiconductor device, gettering means for trapping transition metal are provided in a wafer so as to effectively control the flow of transition metal into a circuit device forming region.

'Gettering' mainly includes intrinsic gettering (IG) and extrinsic gettering (EG).

IG is carried out in such a manner that bulk micro defect (BMD), acting as a gettering site, is provided in a semiconductor device fabrication process by controlling a quantity of interstitial oxygen (Oi) in the wafer manufacturing process. Yet, because the heat treatment temperature in a semiconductor device fabrication process has a tendency to decrease, such a low temperature process makes the formation of BMD as the gettering site more difficult.

Meanwhile, EG includes polysilicon back seal (PBS), back side damage (BSD), high energy implantation, and the like.

A method of manufacturing a silicon wafer to which such a concept of gettering is applied is disclosed in Korean Patent Laid-Open No. 2001-0003616.

Various methods of manufacturing wafers having oxygen precipitate defect layers of high density without grown-in defects in the surface region have been reported or studied. In order to remove grown-in defects in the surface region as well as prepare such oxygen precipitates of high density in the bulk of the wafer, many efforts have been made to study heat treatment thereof. These studies indicate significant differences in the corresponding results depending upon the ways or conditions of the heat treatment.

For instance, in using rapid thermal process (RTP), 'slip' due to RTP temperature occurs occasionally. Moreover, RTP is carried out in such a short time so that it is almost impossible to remove grown-in defects generated from the crystal growth. When an ideal wafer is manufactured using RTP, after having removed grown-in defects at a crystal growth step, RTP is carried out to reinforce the gettering effect so as to form BMD of high density inside the bulk of the wafer. Therefore, there is a limitation on carrying out heat treatment on a substrate as well as hardware.

As an alternative to RTP, there is a method using a diffusion furnace. Yet, such a diffusion furnace method shows different results in accordance with heat treatment conditions such as heat treatment temperature, ramp-up-rate temperature profile, ambient gas, and the like. Moreover, quality obtained using the diffusion furnace method depends greatly on temperature distribution in the furnace, thereby often resulting in irregular quality.

SUMMARY OF THE INVENTION

Accordingly, the present invention is directed to a silicon wafer and fabricating method therefor that substantially obviates one or more problems due to limitations and disadvantages of the related art.

An object of the present invention is to provide a silicon wafer and fabricating method therefor having no COP defect in an active region where a semiconductor device is to be formed, a denuded zone (DZ) at a uniform depth according to oxygen concentration, and a high-density oxygen precipitate defect layer.

To achieve these objects and other advantages and in accordance with the purpose of the invention, as embodied and broadly described herein, a method of fabricating a silicon wafer according to the present invention includes the steps of preparing a silicon wafer by slicing, grinding, and cleaning an ingot, inserting the silicon wafer in a diffusion furnace having an ambience of one of Ar, $N_2$, and inert gas including Ar and $N_2$, pre-heating and maintaining the diffusion furnace at about 500° C., changing the ambience into $H_2$, Ar or inert gas including $H_2$ and Ar successively, increasing a temperature of the diffusion furnace by a temperature-increasing speed of 50~70° C./min between 500~800° C., 10~50° C./min between 800~900° C., 0.5~10° C./min between 900~1000° C., and 0.1~0.5° C./min between 1000~1250° C., maintaining the diffusion furnace at 1200~1250° C. for 1~120 min, changing the ambience inside the diffusion furnace into Ar, $N_2$, or inert gas ambience including Ar and $N_2$ successively, and decreasing the temperature of the diffusion furnace down to 500° C. by a temperature-decreasing speed of 0.1~0.5° C./min between 1000~1250° C., 0.5~10° C./min between 900~1000° C., 10~50° C./min between 800~900° C., and 50~70° C./min between 500~800° C.

Preferably, the method further includes a step of maintaining the temperature of the diffusion furnace at about 1200° C. for about an hour after the step of maintaining the diffusion furnace at 1200~1250° C. for 1~120 min.

In another aspect of the present invention, a silicon wafer having a silicon bulk surrounded edge and two flat surfaces which are almost parallel with each other, comprises a denuded zone having a depth of about 15 micro meters from one flat surface, wherein oxygen precipitates do not exist, and a gettering region under the denuded zone in the silicon bulk, wherein concentration of BMD nuclei is at least $5\times10^5$ ea/cm$^2$ oxygen concentration inside the silicon bulk is preferably 2 to 5 times higher than that of the top surface of the denuded zone.

It is to be understood that both the foregoing general description and the following detailed description of the present invention are exemplary and explanatory and are intended to provide further explanation of the invention as claimed. Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principles of the invention. In the drawings.

DETAILED DESCRIPTION OF THE INVENTION

Reference will now be made in detail to the preferred embodiments of the present invention, examples of which are illustrated in the accompanying drawings.

First, a wafer is prepared by slicing a silicon ingot. When the ingot is sliced, a surface of the wafer becomes uneven so as to be rough.

In order to make such a rough surface of the wafer smooth and even, 'lapping' or 'grinding' is carried out on the uneven surface of the wafer so as to make the surface relatively even.

A cleaning process is then carried out thereon so as to remove particles and contaminants attached to the surface during 'grinding'.

In such a cleaning process, an SC1 cleaning solution ($NH_4OH:H_2O_2:H_2O=1:1:5$) is used. In addition, a cleaning process using an HF solution may be added thereto.

Thereafter, a denuded zone is formed at a predetermined depth in an active region of the wafer, and then heat treatment is carried out on the wafer so as to form BMD nuclei to be used as gettering sites later. Such heat treatment generates growth of nuclei, which form high density BMD enabling the removal of grown-in defects generated from crystal growth as well as the gettering of metal particles, thereby manufacturing an ideal wafer.

Figure 1:
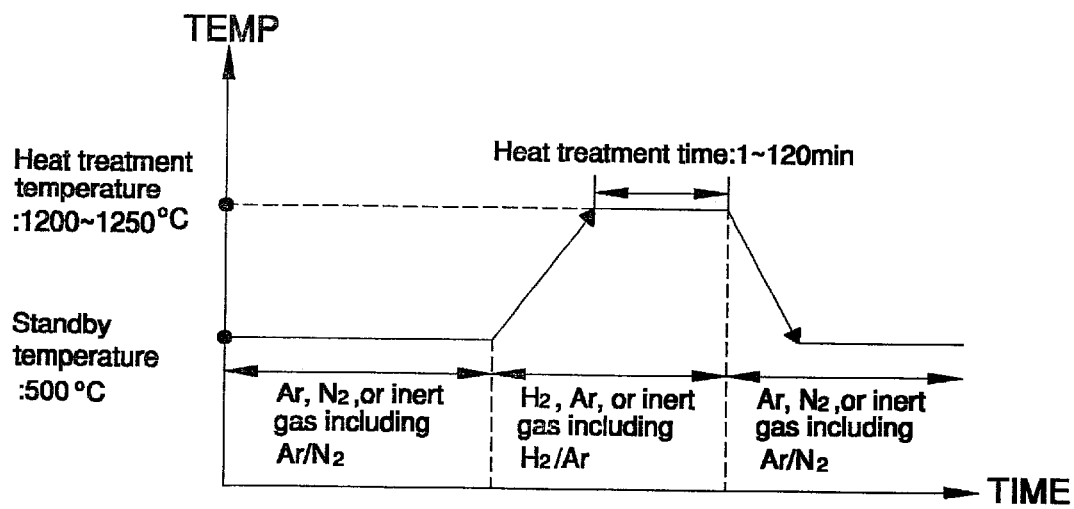
FIG. 1 illustrates a graph of high temperature heat treatment according to an embodiment of the present invention.

FIG. 1 illustrates a graph of high temperature heat treatment according to an embodiment of the present invention.

Referring to FIG. 1, while the ambience of a furnace is maintained with Ar or $N_2$ or inert gas with Ar or inert gas with $N_2$ or inert gas ambience including Ar and $N_2$, a wafer is put into the furnace. The furnace is then pre-heated up to about 500° C.

Subsequently, the ambience of the furnace is changed into $H_2$ or Ar or inert gas including $H_2$ and Ar. High temperature heat treatment is then carried out on the wafer by heating.

In order to control the oxygen precipitate particles which greatly affect quality characteristics of the wafer, such high temperature heat treatment is carried out in a manner such that the temperature is increased up to 1200° C.~1250° C. by varying temperature-increasing and decreasing speeds between every specific heat treatment interval at an ambience of gas mixed with hydrogen and inert gas and, subsequently, that heat treatment is carried out at an inert gas ambience for 1 minute~120 minutes.

The process of increasing the temperature from the pre-heat temperature is carried out in a manner such that the temperature of each of the steps is adjusted properly. Namely, the temperature-increasing speed between 500 and 800° C. is set up as 50 to 70° C./min, that between 800 and 900° C. is set up as 10 to 50° C./min, that between 900 and 1000° C. is set up as 0.5 to 10° C./min, and that between 1000 and 1250° C. is set up as 0.1 to 0.5° C./min.

After the temperature-increasing process, the temperature of the furnace is maintained for 1 to 120 minutes at the heat treatment interval between 1200 and 1250° C. The maintaining time at this interval is set up according to the purpose of controlling COP free depth and oxygen precipitate density in the wafer.

After the gas ambience in the furnace has been changed into Ar or $N_2$ or inert gas including Ar and $N_2$ successively, a temperature-decreasing process is initiated. In this temperature-decreasing process, the temperature-decreasing speed is set up as 0.1 to 0.5° C./min between 1000 and 1250° C., as 0.5 to 10° C./min between 900 and 1000° C., that is set up as 10 to 50° C./min between 800 and 900° C., and as 50 to 70° C./min between 500 and 800° C.

Figure 2:
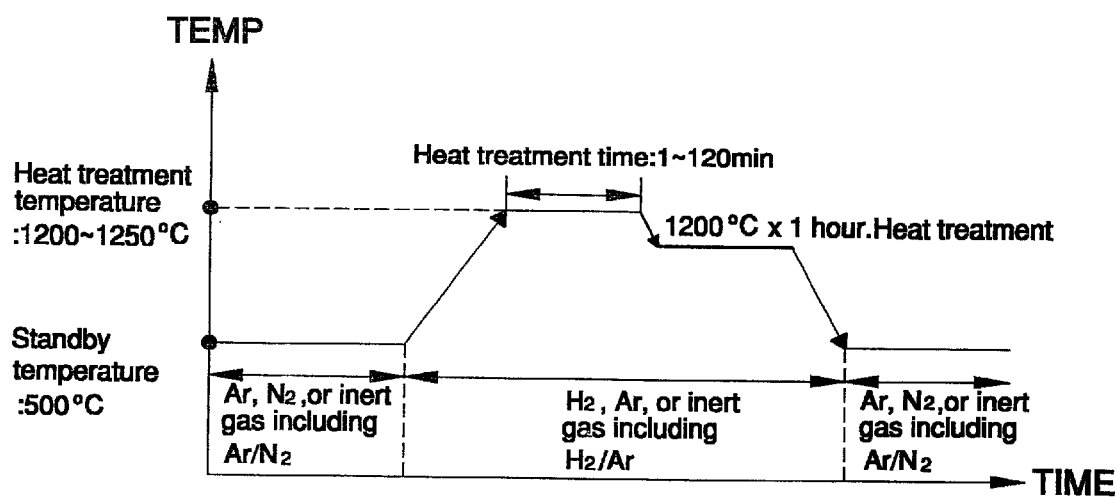
FIG. 2 illustrates a graph of high temperature heat treatment according to another embodiment of the present invention.

FIG. 2 illustrates a graph of a high temperature heat treatment according to another embodiment of the present invention.

Referring to FIG. 2, a furnace, as was done in FIG. 1, is pre-heated to about 500° C. at an ambience of Ar or $N_2$ or inert gas including Ar and $N_2$. After an ambience in the furnace has been changed into $H_2$ or Ar or inert gas including $H_2$ and Ar, high temperature heat treatment is carried out by heating the wafer.

In this case, the temperature is increased by varying speed of increasing temperature of each temperature step. Namely, temperature-increasing speed between 500~800° C. is set up as 50~70° C./min, that between 800~900° C. is set up as 10~50° C./min, that between 900~1000° C. is set up as 0.5~10° C./min, and that between 1000~1250° C. is set up as 0.1~0.5° C./min. After such temperature increasing steps, the temperature of the furnace is maintained at a heat treatment interval between 1200~1250° C. for 1~120 min. The temperature increasing method is as effective as that illustrated in FIG. 1.

After the temperature maintaining period, the temperature is decreased down to 1200° C. at a temperature-decreasing speed of 0.1~0.5° C./min while maintaining the gas ambience in the furnace. The state at 1200° C. is maintained for about an hour.

Thereafter, while maintaining the same ambience in the furnace, the temperature is decreased again. With respect to temperature steps, the temperature is decreased at a temperature-decreasing speed of 0.1~0.5° C./min between 1000 and 1250° C., 0.5~10° C./min between 900 and 1000° C., 10~50° C./min between 800 and 900° C., and 50~70° C./min between 500 and 800° C. Finally, the temperature has been decreased down to 500° C.

The temperature-increasing and temperature-decreasing speeds in the method according to the present invention are set to be slow, thereby minimizing heat shock applied to the wafer during the heat treatment process.

In addition to the temperature being varied slowly, the heat treatment is carried out for a relatively long time, whereby crystal defects at the surface of the wafer are removed. In the wafer, vacancies as point defects are agglomerated so as to generate voids and oxygen precipitate ($SiO_x$). Such defects are reacted with ambience gas so as to diffuse into the surface. Interstitial silicon atoms then move to the voids so as to be re-united, thereby redistributing the crystalline structure. In such a mechanism, oxide particles are resolved into oxygen and silicon so that oxygen atoms are extracted from the crystal structure and silicon atoms enter into the voids. Thus, the crystals are reformed. Therefore, a crystal defect-free region is formed from the wafer surface to a predetermined depth, while BMD nuclei coming from the extracted oxygen atoms, which are agglomerated into small nuclei, exist at a deep position within the wafer.

Figure 3:
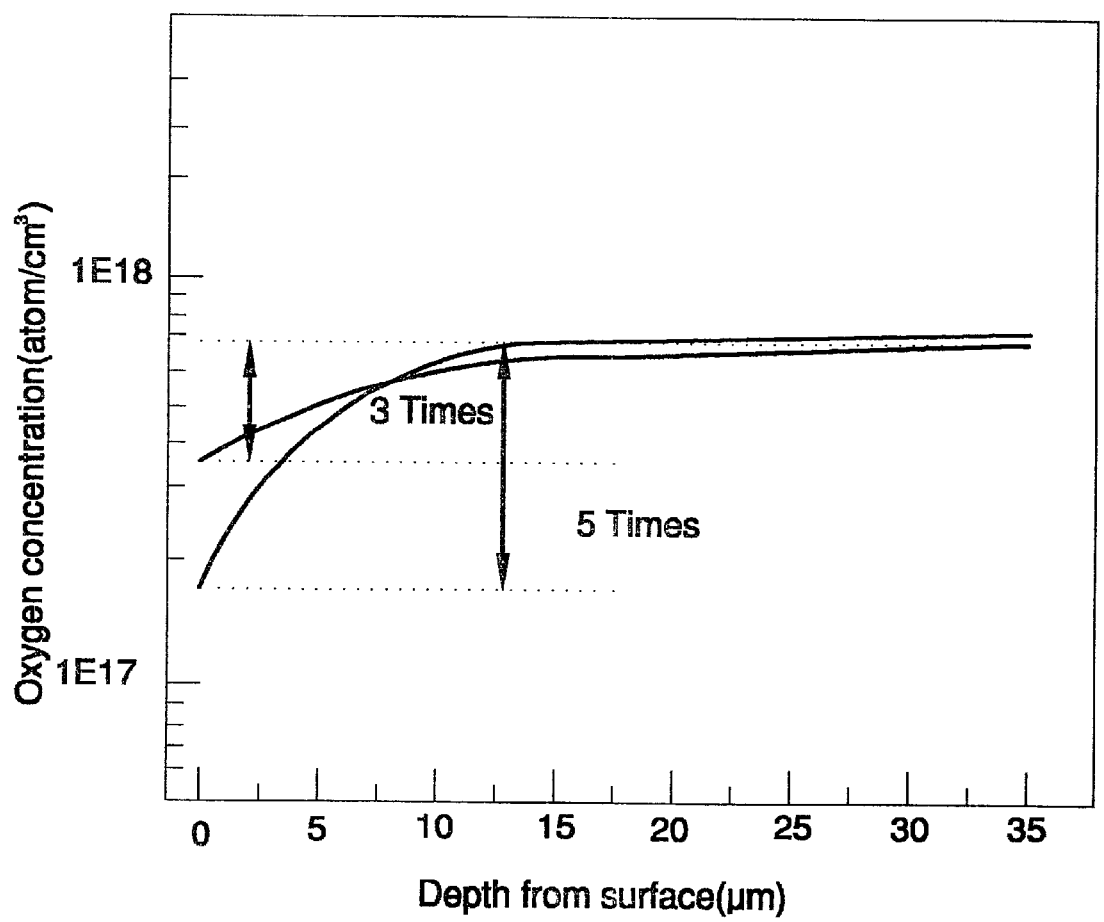
FIG. 3 illustrates a graph of oxygen concentration of a wafer according to the present invention.

FIG. 3 illustrates a graph of oxygen concentration of a wafer according to the present invention.

Referring to FIG. 3, shown is a graph of oxygen concentration between a surface and a predetermined depth of a wafer manufactured by the present invention. Oxygen concentration from the surface to a depth of about 15 μm is greatly reduced to be less than an average of the wafer bulk.

Figure 4:
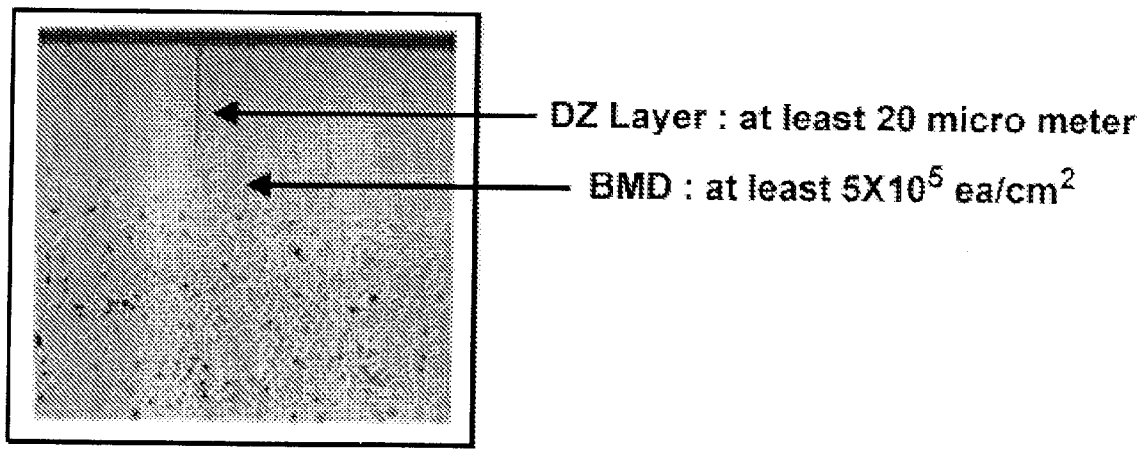
FIG. 4 illustrates a diagram of oxygen precipitate in a wafer according to the present invention.

FIG. 4 illustrates a diagram of oxygen precipitate in a wafer according to the present invention.

Referring to FIG. 4, a denuded zone appears between the surface and a depth of about 20 μm. Additionally, a plurality of BMDs, having nuclei density amounts of at least $5 \times 10^5$ ea/cm², are formed beneath the denuded zone. Each BMD becomes a gettering site trapping metal in the process of fabricating the device.

After such heat treatment, the temperature of the wafer is reduced to room temperature in accordance with a general process.

Then, polishing and final cleaning processes are carried out.

Accordingly, a wafer manufactured by the present invention has a first region free from COP defects between the surface and a predetermined depth (about 20 μm) at a front face of the wafer where semiconductor devices will be fabricated, as well as a second region having a plurality of BMD nuclei beneath the first region.

In the wafer according to the present invention, oxygen concentration at the wafer surface is five times less than that at the bulk inside, a depth of the denuded zone from the wafer surface in the bulk direction is at least 15 to 20 μm, and BMD concentration which increases the gettering effect in a semiconductor fabrication process is at least $5 \times 10^5$ ea/cm².

Therefore, the wafer fabricated by the heat treatment according to the present invention has the denuded zone in the semiconductor device forming region and also provides an excellent gettering effect, thereby being suitable for the fabrication of semiconductor memory devices.

The forgoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A method of fabricating a silicon wafer, comprising steps of:

preparing a silicon wafer by slicing an ingot, grinding and cleaning a sliced wafer;

inserting the silicon wafer in a diffusion furnace having an ambience of one of Ar, $N_2$, and inert gas including Ar and $N_2$;

pre-heating and maintaining the diffusion furnace at about 500° C.;

changing the ambience inside the diffusion furnace into one of $H_2$, Ar and inert gas including $H_2$ and Ar successively;

increasing a temperature of the diffusion furnace by a temperature-increasing speed of 50~70° C./min between 500~800° C., 10~50° C./min between 800~900° C., 0.5~10° C./min between 900~1000° C., and 0.1~0.5° C./min between 1000~1250° C.;

maintaining the diffusion furnace at 1200~1250° C. for 1~120 min;

changing the ambience inside the diffusion furnace into one of Ar, $N_2$, and inert gas ambience including Ar and $N_2$ successively; and decreasing the temperature of the diffusion furnace down to 500° C. by a temperature-decreasing speed of 0.1~0.5° C./min between 1000~1250° C., 0.5~10° C./min between 900~1000° C., 10~50° C./min between 800~900° C., and 50~70° C./min between 500~800° C.

2. The method of claim 1, further comprising a step of maintaining the temperature of the diffusion furnace at about 1200° C. for about an hour after the step of maintaining the diffusion furnace at 1200~1250° C. for 1~120 min.

* * * * *